United States Patent
Agatsuma

(10) Patent No.: US 7,795,893 B2
(45) Date of Patent: Sep. 14, 2010

(54) TEST MODE ENABLE CIRCUIT

(75) Inventor: Shuuji Agatsuma, Toyohashi (JP)

(73) Assignee: DENSO CORPORATION, Kariya (JP)

( * ) Notice: Subject to any disclaimer, the term of this patent is extended or adjusted under 35 U.S.C. 154(b) by 742 days.

(21) Appl. No.: 11/710,940

(22) Filed: Feb. 27, 2007

(65) Prior Publication Data

US 2009/0315582 A1    Dec. 24, 2009

(30) Foreign Application Priority Data

Mar. 2, 2006   (JP) .............................. 2006-056294

(51) Int. Cl.
*G01R 31/02*   (2006.01)
(52) U.S. Cl. ..................................... 324/763
(58) Field of Classification Search ........................ None
See application file for complete search history.

(56) References Cited

U.S. PATENT DOCUMENTS 5,150,044 A * 9/1992 Hashizume et al. ......... 324/763
5,511,029 A * 4/1996 Sawada et al. ............... 365/201
5,587,950 A * 12/1996 Sawada et al. ............... 365/201
6,907,555 B1 * 6/2005 Nomura et al. .............. 714/719
2005/0210347 A1 * 9/2005 Gossmann ................... 714/724

FOREIGN PATENT DOCUMENTS

JP       04181186 A  *  6/1992
JP       05034409 A  *  2/1993

* cited by examiner

*Primary Examiner*—Jermele M Hollington
(74) *Attorney, Agent, or Firm*—Posz Law Group, PLC

(57) ABSTRACT

A test mode enable circuit for putting a device in a test mode includes a serial-to-parallel shift register reset by a reset signal, a decoder circuit, and a gate circuit. The shift register receives and converts a control signal in serial form to control data in parallel form. The decoder circuit receives and decodes the control data to a test mode enable signal that puts the device in the test mode. The decoder circuit outputs the test mode enable signal to the gate circuit only when the control data matches a predetermined key pattern. The gate circuit outputs the test mode enable signal to the device only when at least one of the control signal and the reset signal has a predetermined voltage level.

7 Claims, 6 Drawing Sheets

TEST MODE ENABLE CIRCUIT

CROSS REFERENCE TO RELATED APPLICATION

This application is based on and incorporates herein by reference Japanese Patent Application No. 2006-56294 filed on Mar. 2, 2006.

FIELD OF THE INVENTION

The present invention relates to a test mode enable circuit for putting a device in a test mode upon receipt of control data having a predetermined pattern.

BACKGROUND OF THE INVENTION

Typically, a semiconductor integrated circuit (IC) device incorporates a test mode enable circuit for generating a test mode enable signal. The test mode enable signal puts the IC device in a test mode for testing functional circuits in the IC device.

For example, a test mode enable circuit 101 disclosed in JP-H5-34409A is a 4-bit binary counter and has one input 102, as shown in FIG. 6. The test mode enable circuit 101 counts each pulse of a control signal fed to the input 102 and generates four test mode enable signals T1-T4, each of which corresponds to a different test mode. All of the test mode enable signals T1-T4 are reset to a low level, when a reset signal R (e.g., power-on reset signal) of the low level is fed to the test mode enable circuit 101.

An advantage of the test mode enable circuit 101 is that the four test mode enable signals T1-T4 are generated with only one input 102. However, the IC device may be accidentally put in the test mode by a noise signal applied to the input 102. The IC device can leave the test mode by resetting the reset signal R to the low level. However, if the reset signal R is the power-on reset signal and shared with other circuit blocks on the IC device, the IC device needs to be tuned off to leave the test mode. Therefore, not only the test mode enable circuit 101, but also the other circuit blocks are turned off.

SUMMARY OF THE INVENTION

In view of the above-described problem, it is an object of the present invention to provide a test mode enable circuit for preventing a device from being accidentally put in a test mode and for allowing the device to easily leave the test mode.

A test mode enable circuit for putting a device in a test mode includes a serial-to-parallel shift register, a decoder circuit, and a gate circuit.

The shift register receives and converts a control signal in serial form to control data in parallel form. The shift register includes memory circuits, each of which represents one bit of the control data and is initialized to a first voltage level by a rest signal. Specifically, the control signal is inputted to the shift register synchronously with a clock signal and shifted through the shift register from a first memory circuit corresponding to the least significant bit of the control data to a second memory circuit corresponding to the most significant bit of the control data. Thus, the control signal in serial form is converted to the control data in parallel form.

The decoder circuit receives and decodes the control data into a test mode enable signal that puts a device in a test mode. The decoder circuit outputs the test mode enable signal to the gate circuit when the control data matches a predetermined key pattern. Specifically, the decoder circuit outputs the test mode enable signal when the most significant bit of the control data has a second voltage level different from the first voltage level and at least one of other bits of the control data has a first predetermined voltage level. Therefore, it is unlikely that control data caused by a noise signal matches the key pattern. Thus, the decoder circuit can be prevented from outputting the test mode enable signal when the noise signal is inputted to the shift register.

The gate circuit receives and outputs the test mode enable signal to the device, when at least one of the control signal and the reset signal has a second predetermined voltage level. In such an approach, even in the unlikely event that the control data caused by the noise signal matches the key pattern and the device is put in the test mode, the device can easily leave the test mode by changing the voltage level of the control signal or the reset signal without activating a power-on reset signal.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENTS

First Embodiment

A test mode enable circuit 1 according to a first embodiment of the present invention is shown in FIGS. 1-4. The test mode enable circuit 1 is implemented as an IC together with other functional circuits and operates at a predetermined power supply voltage.

A control signal TESTD is serial data made up of high (H) and low (L) level pulses strung together and fed to the test mode enable circuit 1 from an external source via a terminal of the IC. A power-on reset signal POR is used to reset the IC, i.e., both the test mode enable circuit 1 and the other functional circuits. A rest signal TESTR is used to reset only the test mode enable circuit 1. Each of the power-on reset signal POR and the reset signal TESTR is active low. The power-on reset signal POR, the rest signal TESTR, and a clock signal CLK are produced in the IC and fed to the test mode enable circuit 1. Alternatively, as with the control signal TESTD, the power-on reset signal POR, the rest signal TESTR, and the clock signal CLK are fed to the test mode enable circuit 1 from the external source via the terminal of the IC.

The level of the control signal TESTD is changed synchronously with the clock signal CLK so that the control signal TESTD has various bit patterns. When the control signal TESTD inputted to the test mode enable circuit 1 matches a predetermined key pattern, the test mode enable circuit 1 outputs both a test mode enable signal TESTE and one of test mode select signals TEST1-TEST16 to the IC. Thus, the IC is put in a test mode corresponding to the one of the test mode select signals TEST1-TEST16.

The test mode is used for testing and analyzing the behavior of the internal circuits of the IC. For example, the test mode is used to monitor internal diagnostic information and to analyze defects of the internal circuits. In the test mode enable circuit 1, only when the control signal TESTD matches the key pattern, the IC is put in the test mode or switches to another test mode. In such an approach, a user can be prevented from using the test mode after the shipment of the IC.

Figure 1:
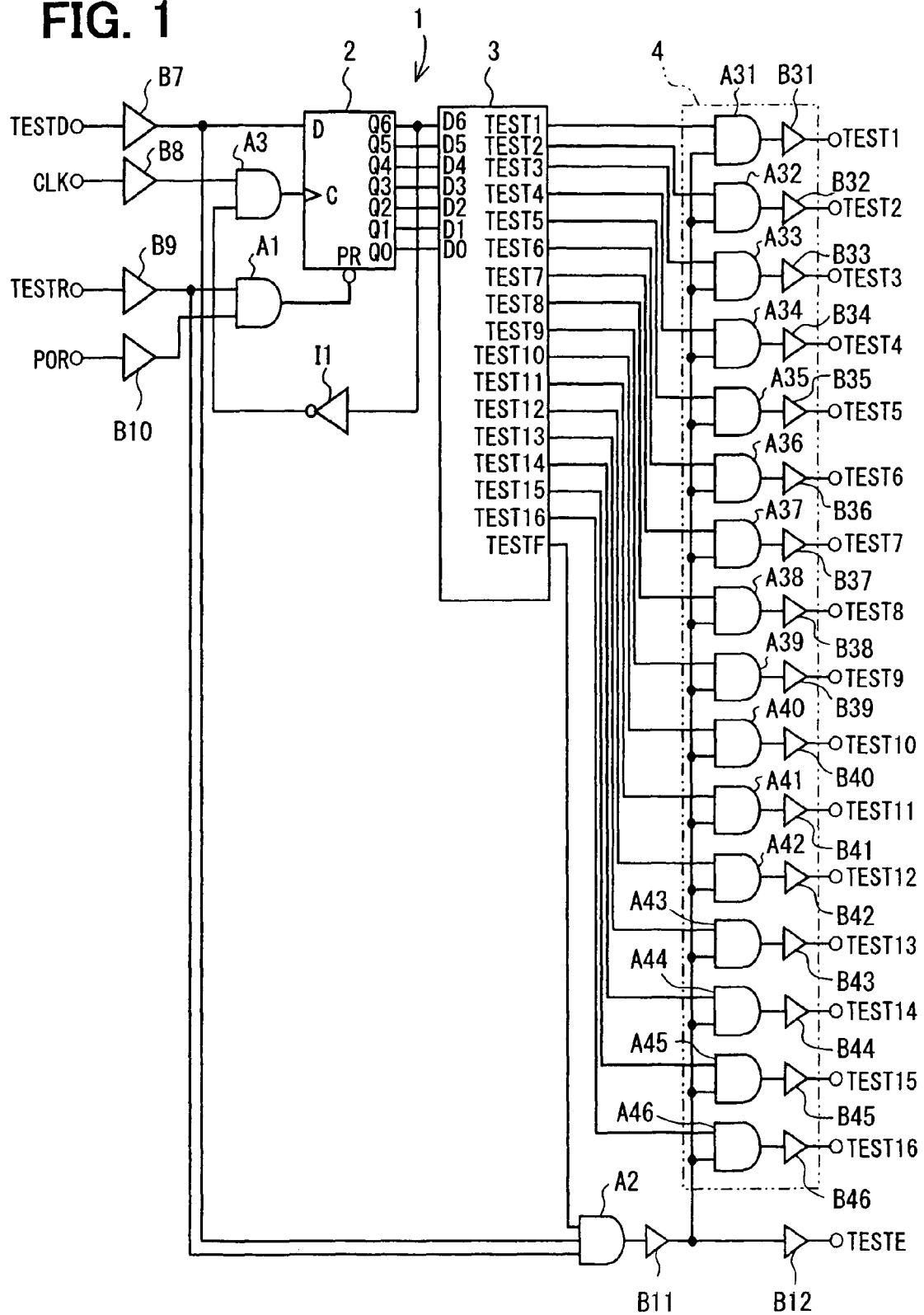
FIG. 1 is a schematic diagram of a test mode enable circuit according to a first embodiment of the present invention.

As shown in FIG. 1, the test mode enable circuit 1 includes a serial-to-parallel shift register 2, a decoder circuit 3, a gate circuit 4, two-input AND gates A1, A3, a three-input AND gate A2, buffers B7-B12, and an inverter I1.

Figure 2:
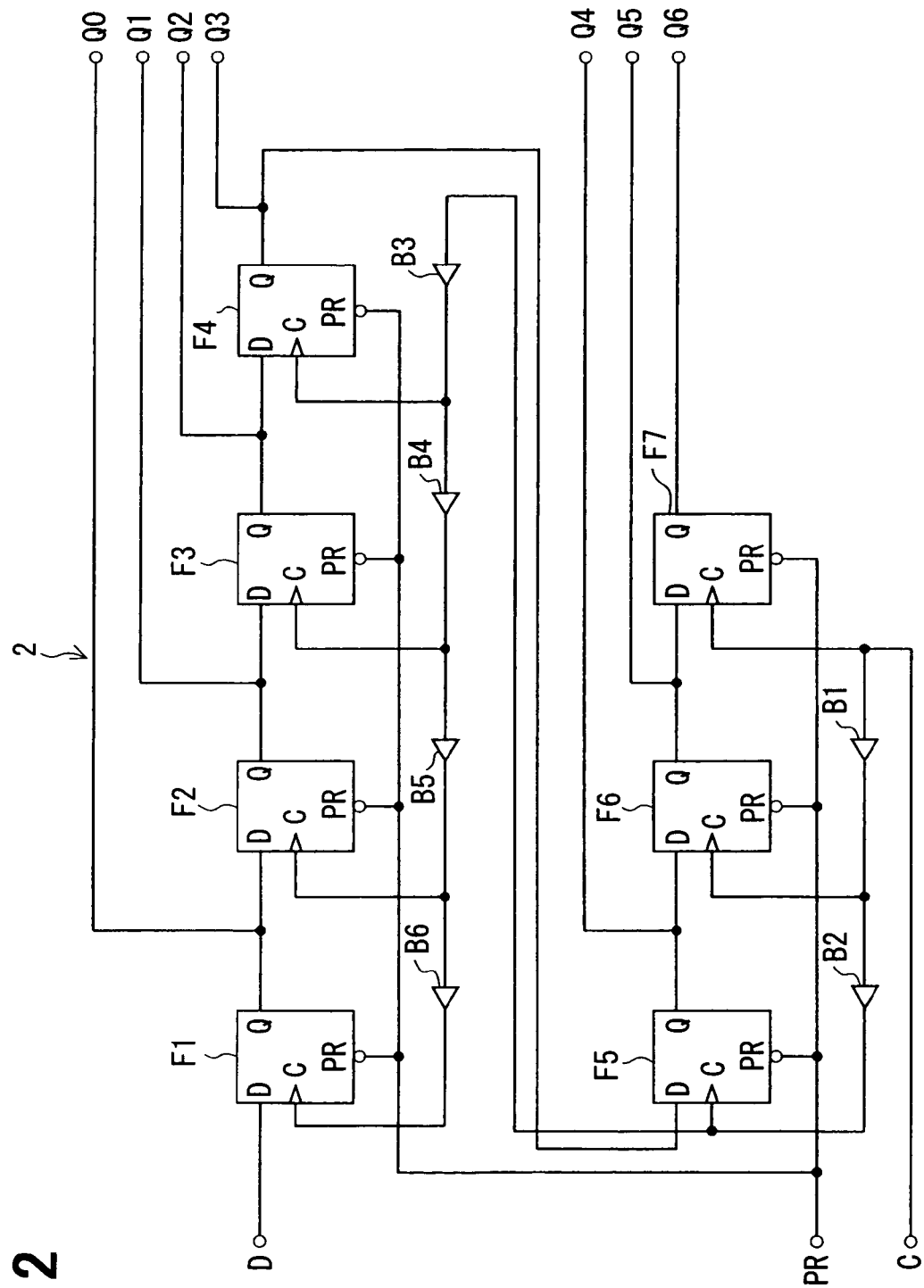
FIG. 2 is a schematic diagram of a shift register in the test mode enable circuit of FIG. 1.

As shown in FIG. 2, the shift register 2 includes seven D-type flip-flops F1-F7 that are connected together in a cascade configuration. Each of the flip-flops F1-F7 represents one bit of the shift register 2 and the flip-flops F1-F7 output data Q0-Q6, respectively. The flip-flop F1 represents the least significant bit (LSB) of the shift register 2 and the flip-flop F7 represents the most significant bit (MSB) of the shift register 2. Each of buffers B1-B6 for timing adjustment is connected between clock inputs C of each adjacent two of the flip-flops F7-F1, respectively. For example, the buffer B1 is connected between the clock inputs C of the buffers F6, F7.

Returning to FIG. 1, the control signal TESTD is fed to a data input D of the shift register 2 via the buffer B7. The clock signal CLK is fed to a clock input C of the shift register 2 via the AND gate A3. Specifically, the clock signal CLK is fed to a first input of the AND gate A3 via the buffer B8 and the data Q6 outputted from the shift register 2 is fed to a second input of the AND gate A3 via the inverter I1. An output of the AND gate A3 is connected to the clock input C of the shift register 2.

The reset signal TESTR and the power-on reset signal POR are fed to a reset input PR of the shift register 2 via the AND gate A1. Specifically, the reset signal TESTR is fed to a first input of the AND gate A1 via the buffer B9 and the power-on reset signal POR is fed to a second input of the AND gate A1 via the buffer B10. An output of the AND gate A1 is connected to the reset input PR of the shift register 2. The reset input PR of the shift resistor 2 is active low. Further, as described above, each of the reset signal TESTR and the power-on reset signal POR is active low. Therefore, when at least one of the reset signal TESTR and the power-on reset signal POR is the low level, the output of the AND gate A1 becomes the low level so that the shift register 2 is reset.

Figure 3:
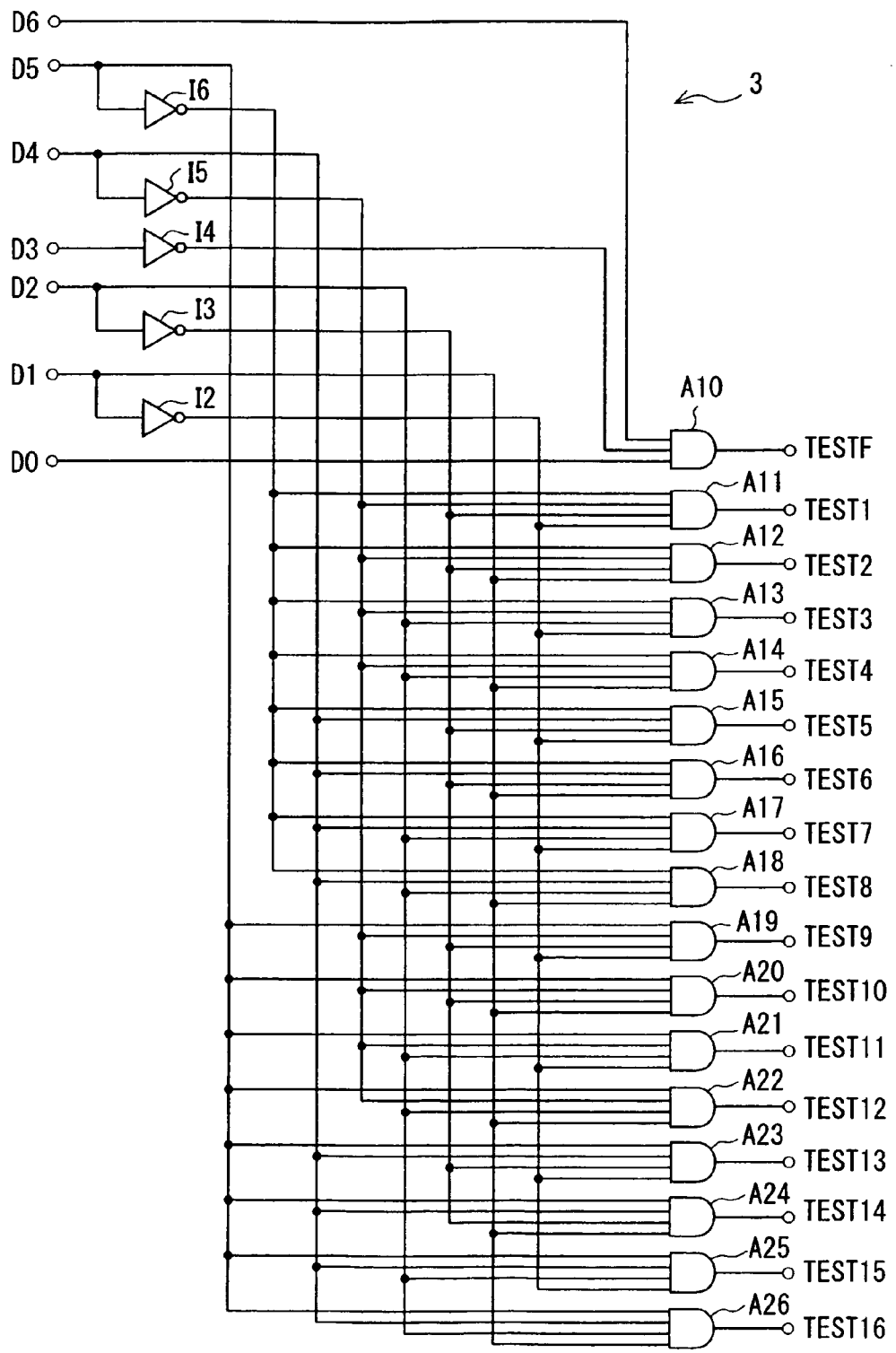
FIG. 3 is a schematic diagram of a decoder circuit in the test mode circuit of FIG. 1.

As shown in FIG. 3, the decoder circuit 3 includes inverters I2-I6, a three-input AND gate A10, and four-input AND gates A11-A26. The data Q6-Q0 outputted from the shift register 2 are fed to inputs D6-D0 of the decoder circuit 3, respectively.

The test mode enable signal TESTF outputted from the AND gate A10 is given by the following Boolean equation:

$$\text{TESTF} = Q6 \cdot \overline{Q3} \cdot Q0 \text{ (i.e., } Q6\text{-}Q0 = H^{}L^{}H)$$

In the Boolean equation, the symbol "·" represents logical AND operation and the symbol "‾" represents logical NOT operation. The "Q6-Q0=HLH" represents that the data Q6 (i.e., MSB of the shift register 2) is the high level, the data Q5, Q4 is Don't care, Q3 is the low level, the data Q2, Q1 is Don't care, and the data Q0 (i.e., LSB of the shift register 2) is the high level. When the data Q6-Q0 outputted from the shift register 2 matches the key pattern "HLH", the AND gate A10 of the decoder circuit 3 outputs the test mode enable signal TESTF.

The test mode select signals TEST1-TEST16 outputted from the AND gates A11-A26, respectively, are given by the following Boolean equations:

$$\text{TEST}^1 = \overline{Q^5} \cdot \overline{Q^4} \cdot \overline{Q^2} \cdot \overline{Q^1} (*LL*LL*)$$

$$\text{TEST}^2 = \overline{Q^5} \cdot \overline{Q^4} \cdot \overline{Q^2} \cdot Q^1 (*LL*LH*)$$

$$\text{TEST}^3 = \overline{Q^5} \cdot \overline{Q^4} \cdot Q^2 \cdot \overline{Q^1} (*LL*HL*)$$

$$\text{TEST}^4 = \overline{Q^5} \cdot \overline{Q^4} \cdot Q^2 \cdot Q^1 (*LL*HH*)$$

$$\text{TEST}^5 = \overline{Q^5} \cdot Q^4 \cdot \overline{Q^2} \cdot \overline{Q^1} (*LH*LL*)$$

$$\text{TEST}^6 = \overline{Q^5} \cdot Q^4 \cdot \overline{Q^2} \cdot Q^1 (*LH*LH*)$$

$$\text{TEST}^7 = \overline{Q^5} \cdot Q^4 \cdot Q^2 \cdot \overline{Q^1} (*LH*HL*)$$

$$\text{TEST}^8 = \overline{Q^5} \cdot Q^4 \cdot Q^2 \cdot Q^1 (*LH*HH*)$$

$$\text{TEST}^9 = Q^5 \cdot \overline{Q^4} \cdot \overline{Q^2} \cdot \overline{Q^1} (*HL*LL*)$$

$$\text{TEST}^{10} = Q^5 \cdot \overline{Q^4} \cdot \overline{Q^2} \cdot Q^1 (*HL*LH*)$$

$$\text{TEST}^{11} = Q^5 \cdot \overline{Q^4} \cdot Q^2 \cdot \overline{Q^1} (*HL*HL*)$$

$$\text{TEST}^{12} = Q^5 \cdot \overline{Q^4} \cdot Q^2 \cdot Q^1 (*HL*HH*)$$

$$\text{TEST}^{13} = Q^5 \cdot Q^4 \cdot \overline{Q^2} \cdot \overline{Q^1} (*HH*LL*)$$

$$\text{TEST}^{14} = Q^5 \cdot Q^4 \cdot \overline{Q^2} \cdot Q^1 (*HH*LH*)$$

$$\text{TEST}^{15} = Q^5 \cdot Q^4 \cdot Q^2 \cdot \overline{Q^1} (*HH*HL*)$$

$$\text{TEST}^{16} = Q^5 \cdot Q^4 \cdot Q^2 \cdot Q^1 (*HH*HH*)$$

Returning to FIG. 1, the gate circuit 4 includes two-input AND gates A31-A46 and buffers B31-B46 connected to outputs of the AND gates A31-A46, respectively. The test mode enable signal TESTF outputted from the decoder circuit 3, the control signal TESTD, and the reset signal TESTR are fed to first, second, and third inputs of the AND gate A2, respectively. The AND gate A2 outputs a test mode enable signal TESTE via the buffers B11, B12. The test mode select signals TEST1-TEST16 outputted from the decoder circuit 3 are fed to first inputs of the AND gates A31-A46, respectively. The test mode enable signal TESTE outputted from the AND gate A2 is fed to each of second inputs of the AND gates A31-A46. Thus, when the test mode enable signal TESTE becomes the high level, the AND gates A31-A46 output the test mode select signals TEST1-TEST16 via the buffer B31-B46, respectively.

Figure 4:
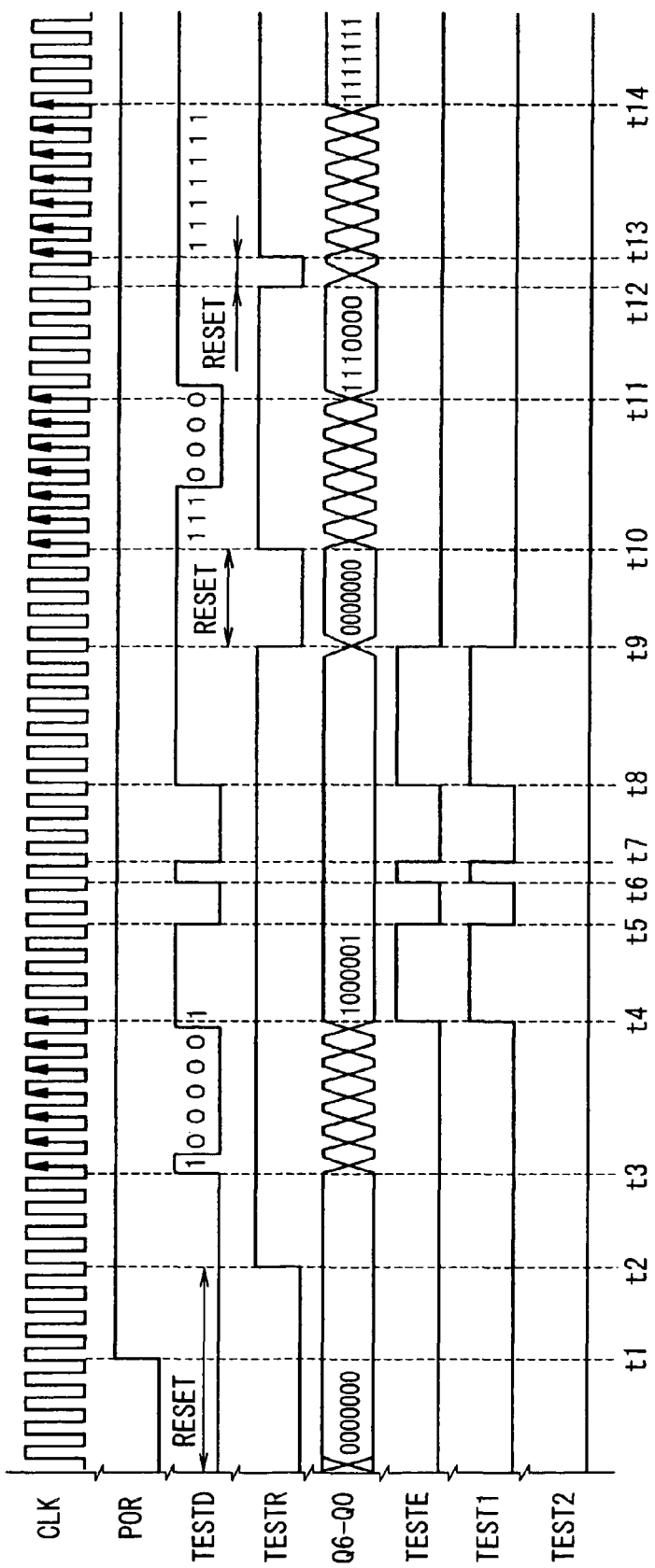
FIG. 4 is a timing diagram of the test mode enable circuit of FIG. 1.

The test mode enable circuit 1 operates as shown in the timing diagram of FIG. 4. After the test mode enable circuit 1 is supplied with the power supply voltage, the power-on reset signal POR becomes the high level (i.e., inactive) at a time t1 and the reset signal TESTR becomes the high level (i.e., inactive) at a time t2. Since each of the power-on reset signal POR and the reset signal TESTR is fed to the shift register 2 via the AND gate A1, the shift register 2 remains in a reset state until the time t2. In the reset state, each data output Q of the flip-flops F1-F7 is the low level so that all the data Q6-Q0 outputted from the shift register 2 is the low level.

When the reset state is released, the control signal TESTD is latched in the flip-flop F1 and shifted through the shift register 2 from the flip-flop F1 to the flip-flop F7 synchronously with each rising edge of the clock signal CLK. The level of the control signal TESTD is changed to "HLLLLLH" (=1000001) in that order synchronously with the clock signal CLK between times t3 and t4. As a result, the data Q6–Q0 outputted from the shift register 2 becomes "HLLLLLH" (=1000001) at the time t4. Since the data Q6 becomes the high level at the time t4, the output of the AND gate A3 becomes the low level at the time t4. Thus, the supply of the clock signal CLK to the shift register 2 is stopped at the time t4.

The decoder circuit 3 changes the test mode enable signal TESTF from the low level to the high level at the time t4, because the data Q6–Q0 matches the key pattern "HLH". Since each of the control signal TESTD and the reset signal TESTR is the high level at the time t4, all the three inputs of the AND gate A2 are the high level. Therefore, the output of the AND gate A2 becomes the high level so that the test mode enable circuit 1 outputs the test mode enable signal TESTE. In this case, only the test mode select signal TEST1 becomes the high level, because each of the data Q5, Q4, Q2, Q1 is the low level. Thus, the test mode enable circuit 1 outputs the test mode select signal TEST1 so that the IC is put in the test mode corresponding to the test mode select signal TEST1.

Then, the control signal TESTD becomes the low level at a time t5 and the output of the AND gate A2 becomes the low level at the time t5. Accordingly, each of the test mode enable signal TESTE and the test mode selection signal TEST1 becomes the low level at the time t5. Then, the control signal TESTD is changed to the high level, the low level, and the high level at a time t6, a time t7, and a time t8, respectively. Accordingly, the test mode enable signal TESTE becomes the high level, the low level, and the high level at the time t6, the time t7, and the time t8, respectively. Thus, once the data Q6–Q0 matches the key pattern "HLH", the test mode enable signal TESTE is changed synchronously with the control signal TESTD. Therefore, the IC can easily leave the test mode by changing the level of the control signal TESTD.

Then, the reset signal TESTR becomes the low level (i.e., active) at a time t9 and all the data Q6–Q0 is reset to the low level at the time t9. As a result, the test mode enable signal TESTE and all the test mode selection signals TEST1-TEST16 are reset to the low level. The reset signal TESTR becomes the high level (i.e., inactive) at a time t10 and the reset state of the shift register 2 is released at the time t10. Then, the shift register 2 restarts to latch and shift the control signal TESTD from the flip-flop F1 to the flip-flop F7 synchronously with each rising edge of the clock signal CLK.

The level of the control signal TESTD is changed to "HHHLLLL" (=1110000) in that order synchronously with the clock signal CLK between times t10 and t11. As a result, the data Q6–Q0 outputted from the shift register 2 becomes "HHHLLLL" (=1110000) at the time t11. Since the data Q6 becomes the high level at the time t11, the output of the AND gate A3 becomes the low level. Thus, the supply of the clock signal CLK to the shift register 2 is stopped at the time 11. In this case, the decoder circuit 3 keeps the test mode enable signal TESTF to the low level, because the data Q6–Q0 outputted from the shift register 2 does not match the key pattern "HLH". Therefore, the output of the AND gate A2 is the low level and all the test mode selection signals TEST1-TEST16 outputted from the gate circuit 4 is the low level.

Then, the reset signal TESTR becomes the low level (i.e., active) at a time t12 and all the data Q6–Q0 is reset to the low level at the time t12. The reset signal TESTR becomes the high level (i.e., inactive) at a time t13 and the shift register 2 restarts to latch and shift the control signal TESTD from the flip-flop F1 to the flip-flop F7 synchronously with each rising edge of the clock signal CLK.

The level of the control signal TESTD remains high between times t13 and t14. As a result, the data Q6–Q0 becomes "HHHHHHH" (=1111111) at the time t14. Since the data Q6 becomes the high level at the time t14, the output of the AND gate A3 becomes the low level at the time t14. Thus, the supply of the clock signal CLK to the shift register 2 is stopped at the time 14. In this case, the decoder circuit 3 keeps the test mode enable signal TESTF to the low level, because the data Q6–Q0 does not match the key pattern "HLH". Therefore, the output of the AND gate A2 is the low level and all the test mode selection signals TEST1-TEST16 outputted from the gate circuit 4 are the low level.

As described above, the test mode enable circuit 1 includes the shift register 2 and the decoder circuit 3. The level of the control signal TESTD serially inputted to the shift register 2 is changed synchronously with the clock signal CLK. The test mode enable circuit 1 changes the test mode enable signal TESTE to the high level, only when the control signal TESTD (i.e., data Q6–Q0) matches the key pattern "HLH". In such an approach, even when the level of the control signal TESTD is changed due to the noise signal in a normal mode of the IC, the IC can be prevented from being put in the test mode unless the control signal TESTD matches the key pattern "HLH". Further, since the control signal TESTD inputted to the test mode enable circuit 1 is in serial form, the test mode enable circuit 1 can achieve the test mode control with a small number of inputs terminal.

The shift register 2 includes seven D-type flip-flops F1-F7 that are initialized to the low level when the reset input PR becomes the low level. The test mode enable circuit 1 outputs the test mode enable signal TESTE for putting the IC in the test mode, when the data Q6–Q0 matches the key pattern "HLH". Specifically, the test mode enable circuit 1 outputs the test mode enable signal TESTE, when the data Q6 of the flip-flop F7 is the high level, the data Q3 of the flip-flop F4 is the low level, and the data Q0 of the flip-flop F1 is the high level. In other words, the test mode enable circuit 1 outputs the test mode enable signal TESTE, when the high level signal as the control signal TESTD is inputted to the shift register 2 at a first time, the low level signal is inputted at a second time three clock cycles later than the first time, and the high level signal is inputted at a third time three clock cycles later than the second time.

The data Q6–Q0 matches the key pattern "HLH", only when a high level signal (i.e., Q6) having a predetermined width and a low level signal (i.e., Q3) having the predetermined width are inputted to and shifted through the shift register 2 in that order. Therefore, it is unlikely that the data Q6–Q0 caused by the noise signal matches the key pattern "HLH". Thus, the test mode enable circuit 1 can be prevented from accidentally outputting the test mode enable signal TESTE to the IC.

The logical AND operation between the test mode enable signal TESTF outputted from the decoder circuit 3, the control signal TESTD, and the reset signal TESTR provides the test mode enable signal TESTE. Therefore, even when the test mode enable signal TESTF becomes the high level, the test mode enable circuit 1 does not output the test mode enable signal TESTF as long as at least one of the control signal TESTD and the reset signal TESTR is the low level. Even in the unlikely event that the data Q6–Q0 caused by the noise signal matches the key pattern "HLH" and the IC is put in the test mode, the IC can easily leave the test mode only by changing the control signal TESTD or the reset signal TESTR to the low level, i.e., without activating the power-on reset signal POR.

The decoder circuit 3 decodes the data Q5, Q4, Q2, Q1 of the data Q6–Q0 into the test mode select signals TEST1-TEST16. Thus, the test mode enable circuit 1 selects a desired test mode from the sixteen test modes and the IC is tested in the desired test mode.

The test mode enable circuit can be reset by not only the power-on reset signal POR, but also the reset signal TESTR. In such an approach, the IC can leave the test mode by resetting only the test mode enable circuit 1, i.e., without resetting the other functional circuits of the IC.

The supply of the clock signal CLK to the shift register 2 is stopped, when the data Q6 (i.e., MSB) of the shift register 2 becomes the high level. Therefore, there is no need of an additional circuit to stop the clock signal CLK and the usability of the test mode enable circuit 1 is improved accordingly.

Second Embodiment

Figure 5:
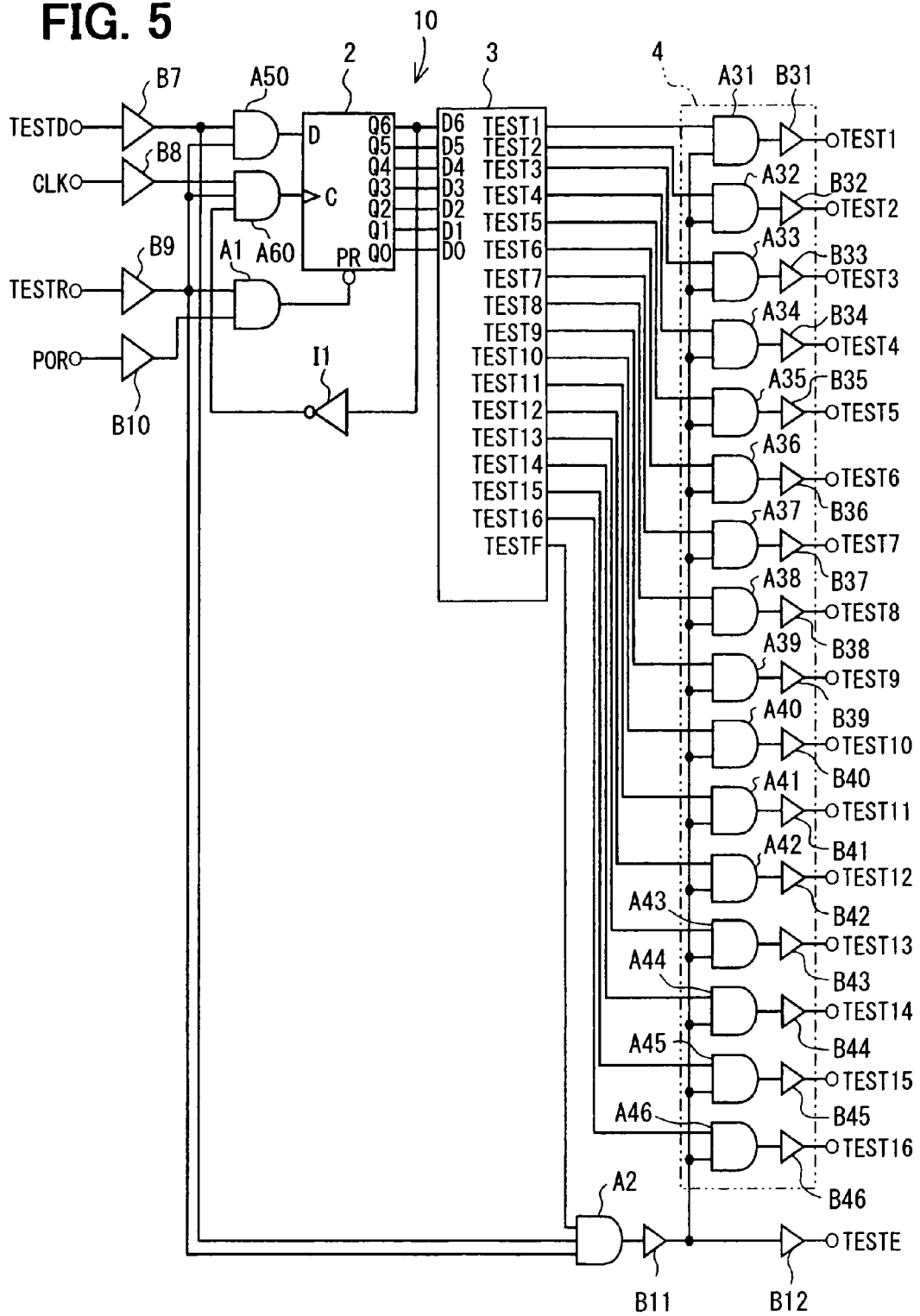
FIG. 5 is a schematic diagram of a test mode enable circuit according to a second embodiment of the present invention.
Figure 6:
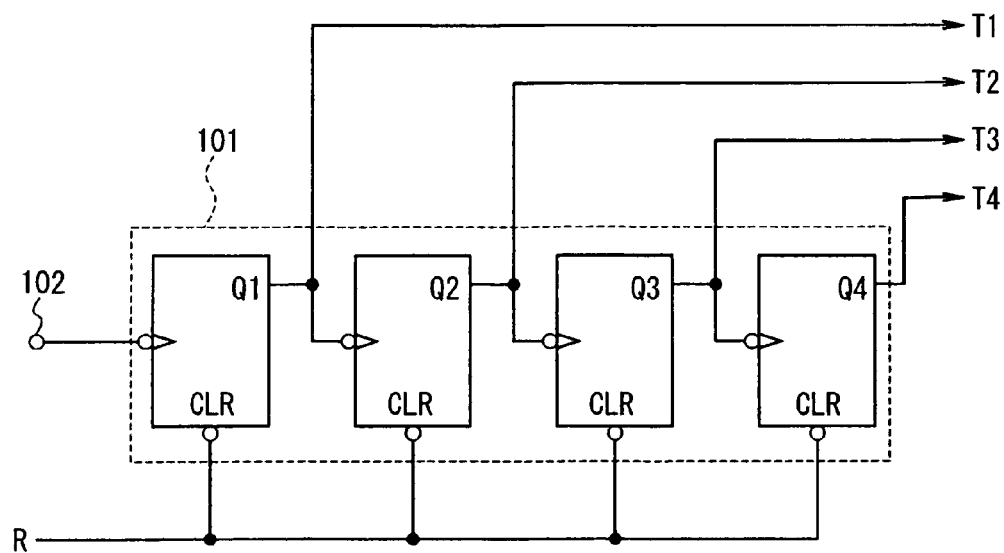
FIG. 6 is a schematic diagram of a conventional test mode enable circuit.

A test mode enable circuit 10 according to a second embodiment of the present invention is shown in FIG. 5. As can be seen by comparing FIG. 1 and FIG. 5, differences between the test mode enable circuits 1, 10 are that the test mode enable circuit 10 further includes a two-input AND gate A60 and the two-input AND gate A3 is replaced with a three-input AND gate A60.

The control signal TESTD is fed to the shift register 2 via the buffer B7 and the AND gate A50. Specifically, the control signal TESTD is fed to a first input of the AND gate A50 and the reset signal TESTR is fed to a second input of the AND gate A50. An output of the AND gate A50 is connected to the data input D of the shift register 2.

The clock signal CLK is fed to the shift register 2 via the buffer B8 and the AND gate A60. Specifically, the clock signal CLK is fed to a first input of the AND gate A60 via the buffer B8, the data Q6 outputted from the shift register 2 is fed to a second input of the AND gate A60 via the inverter I1, and the reset signal TESTR is fed to a third input of the AND gate A60. An output of the AND gate A60 is connected to the clock input C of the shift register 2.

In the test mode enable circuit 10, the control signal TESTD and the clock signal CLK are fed to the shift register 2 via the AND gates A50, A60, respectively, and the reset signal TESTR is fed to each of the AND gates A50, A60. Thus, the control signal TESTD and the clock signal CLK can be prevented from being fed to the shift register 2 as long as the reset signal TESTR is the low level (i.e., active). Therefore, the clock signal CLK can be shared between the test mode enable circuit 10 and the other circuits in the IC so that a terminal for the clock signal CLK can be eliminated from the test mode enable circuit 10. In such an approach, the test mode enable circuit 10 needs only two terminals, one of which is for the control signal TESTD and the other of the which is for the reset signal TESTR, while the test mode enable circuit 1 needs three terminals, one of which is for the control signal TESTD, another of which is for the clock signal CLK, and the other of which is for the reset signal TESTR. Further, the terminal for the reset signal TESTR can be eliminated, for example, by a circuit that changes the level of signal lines, where the reset signal TESTR is applied, to the high level when a high voltage outside the normal operating range is applied to a power supply terminal of the IC. In such an approach, the test mode enable circuit 10 needs only one terminal for the control signal TESTD.

(Modifications)

The embodiment described above may be modified in various ways. For example, the decoder circuit 3 may output the test mode enable signal TESTF when the data Q6 is the high level and at least one of the data Q5–Q0 is a predetermined level. In this case, it is preferable that the one of the data Q5–Q0 is the low level. For example, the decoder circuit 3 may output the test mode enable signal TESTF when the data Q6–Q0 matches a key pattern "HL*" or "H*****L", i.e., when the data Q6 is the high level and the data Q3 or Q0 is the low level. In short, it is preferable that the key pattern is provided as a combination of the high level and the low level. In such an approach, even when the control signal TESTD is fixed at the high level or the noise signal inputted to the shift register 2 is the high level signal having relatively large width, the decoder circuit 3 does not output the test mode enable signal TESTF so that the IC can be prevented from being input to the test mode.

Alternatively, the key pattern may be "HL**H", "H*H", "H*L*H", or "H***LH". As described above, although it is preferable that the key pattern is provided as the combination of the high level and the low level, the key pattern may be "HH**H". In short, various patterns can be used as the key pattern, as long as the data Q6 is the high level.

The shift register 2 may include six or less flip-flops, or eight or more flip-flops.

The decoder circuit 3 may decode the data Q6–Q0 only into the test mode enable signal TESTF. In such an approach, the decoder circuit 3 can be simplified.

The three-input AND gate A3 may be a two-input AND gate. In this case, the test mode enable signal TESTF and the reset signal TESTR may be fed to the AND gate A3. Alternatively, the test mode enable signal TESTF and the control signal TESTD may be fed to the AND gate A3.

The reset signal TESTR may be eliminated. The test mode enable circuits 1, 11 can be applied to various types of semiconductor circuits and also can be applied to not only the IC but also a discrete circuit.

Such changes and modifications are to be understood as being within the scope of the present invention as defined by the appended claims.

What is claimed is:

1. A test mode enable circuit for putting a device in a test mode comprising:
   a serial-to-parallel shift register including a plurality of memory circuits, each of which is initialized to a first voltage level by a reset signal, the shift register receiving and converting a control signal in serial form to control data in parallel form, the control signal comprising a plurality of digital bits, each of which has the first voltage level or a second voltage level and being shifted through the shift register from a first memory circuit of the plurality of memory circuits to a second memory circuit of the plurality of memory circuits to produce the control data, the first memory circuit corresponding to a least significant bit of the control data, the second memory circuit corresponding to a most significant bit of the control data;
   a decoder circuit for receiving the control data from the shift register and for outputting a test mode enable signal that puts the device in the test mode when the most significant bit of the control data has the second voltage level and at least one of other bits of the control data has a first predetermined voltage level; and
   a gate circuit for receiving the test mode enable signal from the decoder circuit, wherein the gate circuit passes the test mode enable signal to the device, when at least one of the bits of the control signal and the reset signal has a second predetermined voltage level.

2. The enable circuit according to claim 1, wherein
the decoder circuit outputs the test mode enable signal when the most significant bit of the control data has the second voltage level and the at least one of other bits of the control data has the first voltage level.

3. The enable circuit according to claim 1, wherein
the decoder circuit outputs the test mode enable signal, when each of the most and least significant bits of the control data has the second voltage level and at least one of the other bits of the control data has the first voltage level.

4. The enable circuit according to claim 1, wherein
the decoder circuit decodes the bits, excluding the most significant bit and the at least one of other bits, of the control data, into a test mode selection signal that determines which test mode the device is put in.

5. The enable circuit according to claim 1, wherein
the plurality of memory circuits of the shift register is initialized to the first level by the reset signal having the first level, and
the gate circuit outputs the test mode enable signal, when each of the control signal and the reset signal has the second voltage level.

6. The enable circuit according to claim 1, further comprising
an OR logic gate, wherein
the shift register has a reset input for receiving the reset signal,
an output of the OR logic gate is connected to the reset input of the shift register,
the reset signal is fed to a first input of the OR logic gate, and
a power-on reset signal is fed to a second input of the OR logic gate.

7. The enable circuit according to claim 1, wherein
the decoder circuit outputs the test mode enable signal only when the most significant bit of the control data has the second voltage level and at least one of other bits of the control data has the first predetermined voltage, and
the gate circuit passes the test mode enable signal to the device only when the at least one of the bits of the control signal and the reset signal have the second predetermined voltage level.

* * * * *